United States Patent
Selva et al.

(10) Patent No.: US 8,161,327 B2
(45) Date of Patent: Apr. 17, 2012

(54) PROCESS AND SYSTEM FOR THE VERIFICATION OF CORRECT FUNCTIONING OF AN ON-CHIP MEMORY

(75) Inventors: Carolina Selva, Cologno Monzese (IT); Cosimo Torelli, Cassina de Pecchi (IT); Danilo Rimondi, Mozzo (IT); Rita Zappa, Milan (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 806 days.

(21) Appl. No.: 12/101,711

(22) Filed: Apr. 11, 2008

(65) Prior Publication Data
US 2008/0256407 A1 Oct. 16, 2008

(30) Foreign Application Priority Data
Apr. 11, 2007 (IT) .............................. VA2007A0041

(51) Int. Cl.
*G06F 11/00* (2006.01)
(52) U.S. Cl. ......................................................... 714/30
(58) Field of Classification Search .................. 714/6, 7, 714/10, 25–27, 29–32, 36–38, 42, 45, 48, 714/54
See application file for complete search history.

(56) References Cited

U.S. PATENT DOCUMENTS

| | | | |
|---|---|---|---|
| 5,742,616 A * | 4/1998 | Torreiter et al. | 714/732 |
| 6,353,563 B1 * | 3/2002 | Hii et al. | 365/201 |
| 6,408,401 B1 * | 6/2002 | Bhavsar et al. | 714/7 |
| 6,760,865 B2 * | 7/2004 | Ledford et al. | 714/30 |
| 7,284,166 B2 * | 10/2007 | Zappa et al. | 714/710 |
| 7,428,663 B2 * | 9/2008 | Morton et al. | 714/36 |

* cited by examiner

*Primary Examiner* — Nadeem Iqbal
(74) *Attorney, Agent, or Firm* — Allen, Dyer, Doppelt, Milbrath & Gilchrist, P.A.

(57) ABSTRACT

A method is for making an integrated circuit with built-in self-test. The method includes forming at least one nonvolatile read only memory (ROM) to store ROM code and forming a logic self-test circuit to verify a correct functioning of the at least one nonvolatile ROM. Moreover, the method includes defining, in the logic self-test circuit, a logic self-test core to process the ROM code and to generate a flag based upon a control signature and defining, in the logic self-test circuit, a nonvolatile storage block, coupled to the logic self-test core, to store the control signature. Furthermore, the method includes writing the ROM code to the at least one nonvolatile ROM and writing the control signature to the nonvolatile storage block, during a same fabrication step.

16 Claims, 2 Drawing Sheets

PROCESS AND SYSTEM FOR THE VERIFICATION OF CORRECT FUNCTIONING OF AN ON-CHIP MEMORY

FIELD OF THE INVENTION

This invention relates in general to the fabrication of very large integration scale systems, for example SoCs (System-on-Chip) or ASICs (Application Specific Integrated Circuit), embodied in a nonvolatile memory device, and, more particularly, to devices including a logic machine defined BIST or M-BIST (memory built-in self testing) for the verification of correct functioning of a nonvolatile memory device that uses a control signature, or more briefly a signature, stored in the same logic machine integrated in the device.

BACKGROUND OF THE INVENTION

The ever increasing complexity of integrated circuits, the quest for more specialized functions, and the characteristics and performances of which must satisfy stringent specifications imposed by the user/customer make the verification of devices for testing whether they are compliant or not with specifications increasingly difficult and laborious. The need of developing testing methods and technologies for keeping the cost of the means necessary for carrying out such complex tests on each single device low, in an economical viable manner, has fostered the development of different architectural approaches for containing overall costs.

An effective approach may be integrating on the same device an appropriate logic machine for the verification of the correct functioning, commonly called by the acronym BIST.

This logic machine may be for the verification of the logic circuitry implemented in the device and/or specifically for verifying the functioning of nonvolatile memories included in the device, typically read only memories (ROM), for example one time programmable ROMs (OTP) and the so-called few time programmable ROMs (FTP).

During the realization of the BIST system, on the basis of a specific set of data stored in the ROM, indicated as the ROM code, a control signature value is calculated, upon which the logic machine (BIST) for the verification of correct functionality is based. In order to make controls as fast as possible, the bit-string of the control signature that is generated by the logic circuitry for processing the ROM code may be chosen to be all "0".

In practice, BIST modules for the verification of the functionality of similar ROMs but having different ROM codes have a different architecture depending on the signature that they may verify.

At the beginning of the routine, that may be executed when the self test of a ROM is commanded, the related BIST machine reads the ROM code stored in the memory, processes it, and generates the corresponding signature value. Naturally, the BIST machine executes the algorithm for generating the signature value defined while implementing the BIST. As a consequence, if the elaboration of the code by the BIST logic generates the desired result, the test is passed. If the control signature stored in the BIST system does not match the signature resulting from the execution of the self-test, the BIST system itself generates an error flag (test failed).

Generally, BIST modules are Soft-IP, that is they are defined through a hardware description language, typically through a RTL (Register Transfer Level) flow. The expected signature value of each self-test of the functioning of the memory is stored in the BIST system when the self-test circuit of the memory is generated by the RTL flow.

When the device is realized and the consequent "place and route" process is carried out, such a control signature is written and tied to the particularly stored ROM code, for which it has been calculated.

These features and peculiarities of implementation of BIST modules may not be compliant with the needs of reducing fabrication costs and with the related techniques of late programming of nonvolatile memory devices (ROM, OTP or FTP), for a more favorable flexibility of organizing the fabrication of devices destined to different uses and/or customers. Indeed, according to these cost efficient embodiments of BIST modules, the same logic machine may be unusable with a different ROM code to be stored in the memory at the time of late programming the ROM according to possibly modified customer's request.

Manufacturers often establish a certain ROM code during the design and validation phase of prototypes of a new device and based on a certain signature they define the logic circuit of the BIST to be implemented in the device. If the ROM code may be changed for complying with special customer requirements, the existing BIST may no longer be self-testable because it is helpful to modify the logic circuit of the BIST, with an attendant increase of costs for accordingly modifying the fabrication process during front-end phases for making the functions of the BIST compliant with the different ROM code that is requested.

Memories programmable during back-end phases of the fabrication process of the devices are ever more generally used in complex integrated systems. The possibility of storing in the nonvolatile memory a ROM code specific for the use of the device at one of the back-end phases of the fabrication process, allows a last-minute modification of the code for best adapting it to intervened changes in the application in terms of contents and of instructions.

The importance of flexibility in these fabrication processes may be well comprehended when considering that the so-called "Systems on Chip" (SoC) are devices destined to be manufactured for different customers and for different applications. Economies dictates that the design of a device be sufficiently flexible for being proposed for applications that are very different among them.

When an on-chip ROM memory may be programmed with a different code from the original design code, the BIST module implemented on the basis of a certain ROM code, may be no longer able to verify the functionality of the memory in which a different ROM code has been stored.

This may be significant in the case of complex SoC devices, because during the design of the device it may happen that the ROM code is modified and in these cases it may be likely that the already realized respective BIST module may not be compliant with it. During the commercial life of a device, the ROM code may be adapted to new requirements, determining a similar inadequacy of the BIST module.

In all these cases the new ROM code may be helpfully verified by connecting the device to a test machine, because the self-test BIST structure integrated on the chip may no longer be useful, thus resulting in long verification times and related costs.

SUMMARY OF THE INVENTION

The process of definition and implementation and a now found architecture for an on-chip BIST system for a nonvolatile read only memory, programmable one or more times, may effectively overcome these drawbacks and constraints.

This approach relates to a process of definition and programming of a ROM code in a nonvolatile memory of a device being fabricated that includes at least a nonvolatile read only memory programmable one or more times (ROM, OTP, FTP) and a logic machine for the verification of the functionality of the nonvolatile memory by processing the ROM code stored in the memory and generating a result compliant or not with a certain control signature defined for the code stored in the memory. The logic machine elaborates the content according to a certain algorithm. The value of the control signature, that may be a bitstring, may be associated in a nonvolatile way to the circuitry of the on-chip logic machine, (i.e. the BIST core) together with the writing of the code in the memory.

Differently from known systems, the logic verification machine (BIST) comprises a dedicated nonvolatile support for storing a pre-established control signature and a "core" that calculates the value of the signature corresponding to the ROM code stored in the memory and compares it with the control signature stored in the corresponding nonvolatile storage block. The architecture of the logic circuitry of the "core" that processes the content of the memory (ROM code), according to the pre-established algorithm for generating a certain code signature value, is not established as in prior art systems on the basis of the control signature that is expected to be generated at each verification of the correctness of the ROM code, therefore, even if, according to the approach, the logic circuitry of the BIST is realized in the earliest phases of the fabrication process on the basis of a not necessarily unchangeable ROM code, it remains usable even after a different ROM code happens to be subsequently stored in the ROM.

According to another embodiment, the value of a control signature calculated for the ROM code to be written in the memory of the device, in function of the same algorithm that had been used for generating and implementing the logic circuitry of the processing core of the on-chip verification machine, is stored on a nonvolatile block together with the ROM code. For example, in case of a ROM memory, this recording of the ROM code and of the specifically calculated control signature takes place during the phase of the fabrication process at which the ROM code is written in the memory, perhaps using the same program mask.

According to a preferred embodiment, particularly useful for nonvolatile memories that are electrically programmable one or more times, even the dedicated nonvolatile storage block in which the specifically calculated control signature is recorded is electrically programmable/reprogrammable, such that the control signature itself can be updated every time the manufacturer of the devices and/or the user write a different code in the ROM. It is thus possible to carry out the indispensable control of correctness of a newly recorded ROM code still using the same BIST logic circuitry that was realized in the device even if the new ROM code is different from the code originally initially contemplated by the designer/manufacturer of the device.

According to the method embodiment, the value of a specific control signature is calculated at each updated version of the ROM code to be programmed in the nonvolatile memory of the device. Both the ROM code and the related control signature may be recorded at the same time, the ROM code in the nonvolatile memory of the device and the related control signature in the dedicated nonvolatile storage block, perhaps at the same phase of the fabrication process of the device.

The fact that the value of the control signature stored in the BIST system can be redefined after the realization of the logic BIST circuitry, maintains full functionality of the logic self-test machine of the functioning of the nonvolatile memory that has been implemented in the device fabrication process even if the ROM code to be eventually programmed in the nonvolatile memory of the device is for any reason or need re-defined and written in the ROM memory of the device.

The value of the control signature, recalculated for a modified ROM code, can be stored in the dedicated nonvolatile storage block without requiring any change of the circuit components of the logic self-test machine. It may be sufficient to connect the processing "core" circuitry that calculates the signature to the storage block of the control signature through controlled switches, to be turned on for modifying the non volatily stored control signature when it is recalculated for a new ROM code stored in the nonvolatile memory. In the case of a ROM type nonvolatile supports, that are one-time programmable by defining interconnections and/or electric paths in a metal layer of the device being fabricated, even the value of the control signature may be recorded in an advanced phase of the fabrication process, with an evidently enhanced cost-efficiency of manufacturing.

When the value of the control signature is stored in the BIST system at the same time the ROM code is programmed in the on-chip memory, costs of adaptation of the design of the BIST circuitry of the complex device to new uses and/or applications are eliminated.

DETAILED DESCRIPTION OF THE PREFERRED EMBODIMENTS

Figure 1:
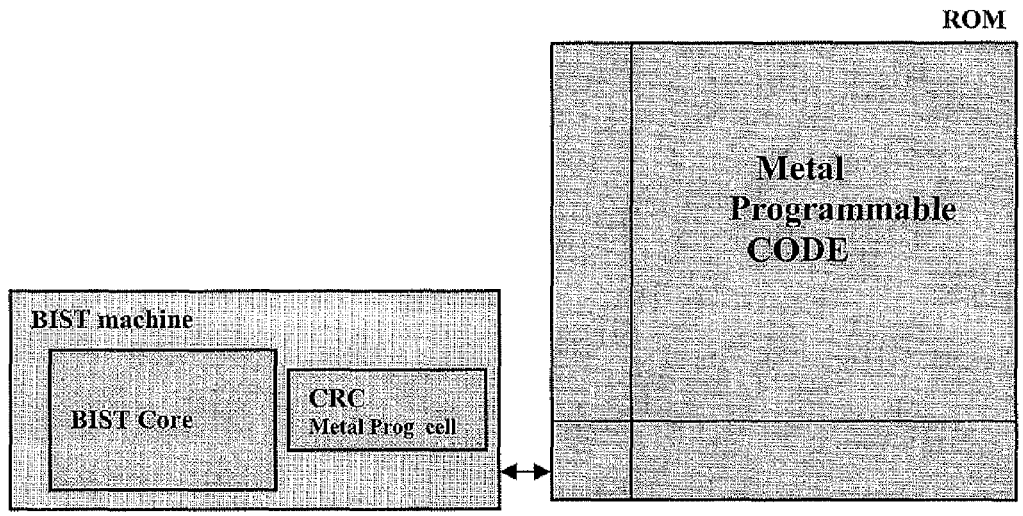
FIGS. 1 and 2 are basic diagrams of BIST systems, respectively for the case of a ROM memory and for a nonvolatile memory electrically programmable one or more times, in accordance with the present invention.
Figure 2:
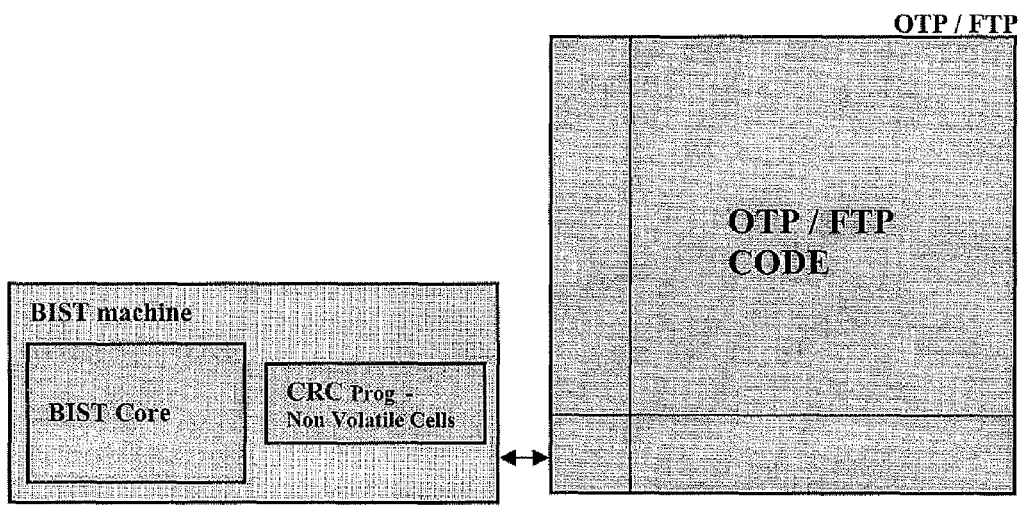

The diagrams of FIGS. 1 and 2 illustrate exemplary architectures of BIST systems according to this approach for self-testing the functionality of a nonvolatile memory (ROM, OTP or FTP) storing a certain ROM code, including a prior defined and implemented logic processing machine (BIST Core) capable of calculating a signature for the ROM code as stored in the memory, in order to verify the correct functioning of the nonvolatile memory, and a dedicated nonvolatile storage block (CRC), rewritable or not, coupled to the BIST Core circuitry, in which is recorded the value of a control signature that has been specifically calculated for the ROM code to be stored in the memory (ROM, OTP or FTP) of the devices being fabricated.

The logic circuitry (BIST Core) of the BIST system is realized in the device during a front-end phase of the fabrication process, whilst the specific control signature for the ROM code to be stored in the memory (ROM, OTP or FTP) is recorded at a later phase of the fabrication process together with the writing of the ROM code in the memory (ROM, OTP, or FTP).

Therefore, the BIST architecture may not depend from the particular signature that it should verify, therefore it may be designed and realized during early phases of the fabrication process, when the ROM code and the relative control signature, depending on which the logic circuitry of the BIST is defined and realized on the chip, are not yet those that may ultimately be used.

Once the ROM code is written in the nonvolatile memory of the device, the corresponding control signature is calculated using the data processing algorithm of the ROM code used during the design and validation phases of the device prototype for defining and realizing the logic processing circuitry generating a certain control signature for such a design ROM code (that most often may not be the code that will eventually be used) and the ROM code and the calculated control signature are both recorded, perhaps at the same time, in respective nonvolatile storage blocks. In case of a ROM programmed at metal level or at diffusion level, it is even possible to use the same program mask.

Figure 3:
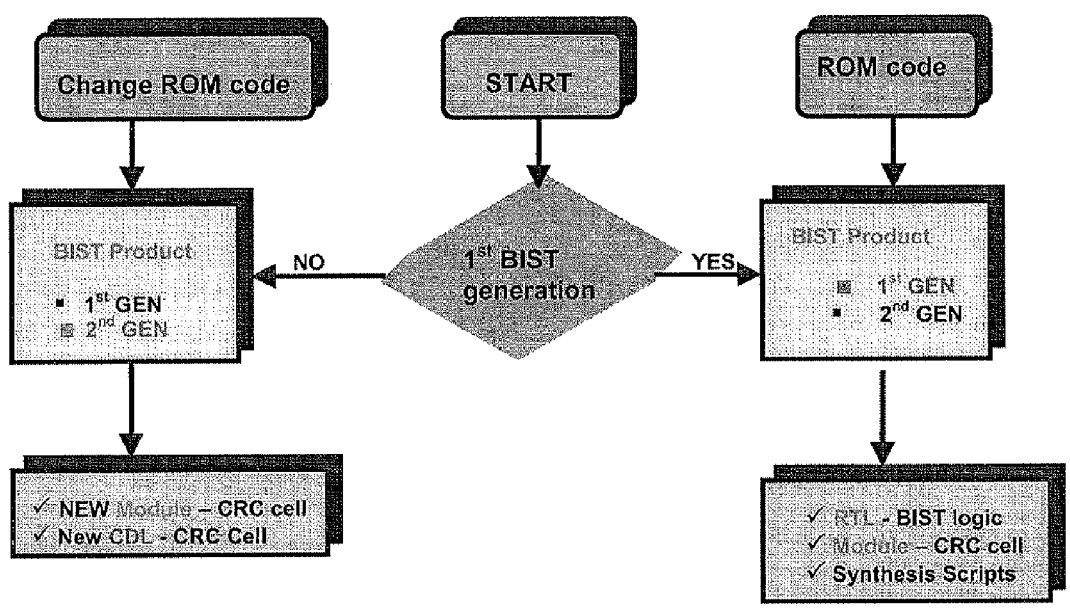
FIG. 3 shows a flow chart for defining the BIST system, in accordance with the present invention.

According to an alternative embodiment, in case the nonvolatile memory is electrically programmable, for example it is an OTP or FTP memory, the dedicated nonvolatile storage block for the control signature may advantageously comprise nonvolatile memory cells of a similar type as the memory array, so that a specifically calculated control signature and the ROM code are re-definable by the user himself without impairing the existing logic BIST circuitry (BIST Core) that thus remains usable for self-testing the correct functioning of the nonvolatile memory in which the ROM code is written, thus limiting the burden of the verification of the single devices that are produced that, otherwise, might be carried out entirely by the external test machine through the execution of complex time consuming routines and data processing operations. FIG. 3 depicts a flow chart that qualitatively illustrates the definition process of the BIST core circuitry according to this approach.

If the control signature has not yet been written in the nonvolatile storage block of the BIST for the first time (YES), the architecture of the core circuitry of the on-chip logic verification machine is defined in function of a certain ROM code (Netlist of BIST engine) intended to be stored in the nonvolatile memory (ROM, OTP or FTP) and a related control signature is calculated and stored in the dedicated nonvolatile storage block (CRC signature). On the occasion of modifying the ROM code and of updating the calculated value of the related control signature, because the user wishes to modify the originally stored ROM code (Change ROM code), the core circuitry need not be adapted, but it is used to calculate a new control signature for the new ROM code using the algorithm that was used for defining and implementing the logic core circuitry of the BIST in function of the original ROM code in order to produce the value of the original control signature as confirmation of the correctness of the memory and store it in the dedicated rewritable internal storage block of the BIST system.

According to an alternative embodiment, the read only nonvolatile memory block in which the control signature for the ROM code to be stored in the nonvolatile memory (ROM, OTP or FTP) is stored, can even be a dedicated location of the same nonvolatile memory, for example by adding a row of cells to the array and providing for at least an additional address to the dedicated memory location in which the calculated control signature will be stored.

In this case, the on-chip BIST machine, besides reading the ROM code and processing it for generating a signature value, will read also the control signature value stored in the dedicated memory location, thus verifying by comparison whether the signature value generated by processing the ROM code corresponds or not to the recorded control signature value, and generate an error flag if the two values differ from each other.

This last embodiment is particularly efficient in case of use of a nonvolatile electrically programmable read only memory because it offers to the customer/user of the device flexibility in allowing the modification of the ROM code for adapting it to new requirements.

In this case, it may also be possible to shorten test times of devices by providing a further free memory location in which eventually a complement value of the value of the new control signature, calculated for a modified ROM code, can be stored, such to restore a multibit string of the resultant control value, comprising zeroes and thus being more rapidly verifiable by the test machine for reducing the test time per device.

That which is claimed is:

1. A method of making an integrated circuit with built-in self-test, the method comprising:
    forming at least one nonvolatile read only memory (ROM) to store ROM code;
    forming a logic self-test circuit to verify a correct functioning of the at least one nonvolatile ROM;
    defining, in the logic self-test circuit, a logic self-test core to process the ROM code and to generate a flag based upon a control signature;
    defining, in the logic self-test circuit, a nonvolatile storage block, coupled to the logic self-test core, to store the control signature;
    writing the ROM code to the at least one nonvolatile ROM and writing the control signature to the nonvolatile storage block, during a same fabrication step.

2. The method according to claim 1, wherein the flag indicates whether a result of processing the ROM code is congruent with the control signature.

3. The method according to claim 1, wherein the fabrication step comprises at least one of a diffusion, a metal formation, and a via formation step, using a same program mask.

4. The method according to claim 1, wherein the fabrication step comprises an electronic programming step.

5. A method of making an integrated circuit with built-in self-test, the method comprising:
    forming at least one nonvolatile read only memory (ROM) to store ROM code;
    defining in the at least one nonvolatile ROM a dedicated storage block, for storing a control signature;
    forming a logic self-test circuit to verify a correct functioning of the at least one nonvolatile ROM;
    defining, in the logic self-test circuit, a logic self-test core to process the ROM code and to generate a flag based upon the control signature;
    writing the ROM code to the at least one nonvolatile ROM and writing the control signature to the dedicated storage block, during a same fabrication step.

6. The method according to claim 5, wherein the flag indicates whether a result of processing the ROM code is congruent with the control signature.

7. The method according to claim 5, further comprising defining in the at least one nonvolatile ROM an additional dedicated storage block to store a complemented value of the control signature.

8. The method according to claim 5, wherein the fabrication step comprises at least one of a diffusion, a metal formation, and a via formation step, using a same program mask.

9. The method according to claim 5, wherein the fabrication step comprises an electronic programming step.

10. An integrated device comprising:
    at least one nonvolatile read only memory (ROM) to store a ROM code; and
    a logic self-test circuit to verify a correct functioning of said at least one ROM and comprising
        a logic self-test core to process contents of said at least one nonvolatile ROM to generate a flag based upon a control signature,
        a nonvolatile storage block coupled to said logic self-test core to store the control signature, and
        an additional addressable storage block to store a complemented value of the control signature.

11. The integrated device of claim 10, wherein the flag indicates whether a result of processing the ROM code is congruent with the control signature.

12. The integrated device of claim 10 wherein said at least one nonvolatile ROM and said nonvolatile storage block are programmable in a same fabrication step.

13. The integrated device according to claim 10, wherein said at least one nonvolatile ROM and said nonvolatile storage block are re-programmable at least one time.

14. An integrated device comprising:

at least one nonvolatile read only memory (ROM) to store a ROM code and having an addressable storage block to store a control signature;

said at least one nonvolatile ROM further comprising an additional addressable storage block to store a complemented value of the control signature;

a logic self-test circuit to verify a correct functioning of said a least one ROM and comprising a logic self-test core to process contents of said at least one nonvolatile ROM to generate a flag based upon the control signature.

15. The integrated device according to claim 14, wherein the flag indicates whether a result of processing the ROM code is congruent with the control signature.

16. The integrated device according to claim 14, wherein said at least one nonvolatile ROM and said addressable storage block are re-programmable at least one time.

* * * * *